United States Patent
Marakhtanov et al.

(10) Patent No.: US 11,670,486 B2
(45) Date of Patent: *Jun. 6, 2023

(54) PULSED PLASMA CHAMBER IN DUAL CHAMBER CONFIGURATION

(71) Applicant: Lam Research Corporation, Fremont, CA (US)

(72) Inventors: Alexei Marakhtanov, Albany, CA (US); Rajinder Dhindsa, San Jose, CA (US); Eric Hudson, Berkeley, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/832,907

(22) Filed: Mar. 27, 2020

(65) Prior Publication Data

US 2020/0227237 A1 Jul. 16, 2020

Related U.S. Application Data

(62) Division of application No. 13/227,404, filed on Sep. 7, 2011, now abandoned.

(51) Int. Cl.
*H01L 21/00* (2006.01)
*H01J 37/32* (2006.01)
(Continued)

(52) U.S. Cl.
CPC .. *H01J 37/32146* (2013.01); *H01J 37/32091* (2013.01); *H01J 37/32357* (2013.01); *H01J 37/32825* (2013.01); *H01L 21/31116* (2013.01); *H01L 21/67069* (2013.01); *H01J 2237/3341* (2013.01)

(58) Field of Classification Search
USPC .................................................. 118/723 ER
See application file for complete search history.

(56) References Cited

U.S. PATENT DOCUMENTS 5,476,182 A * 12/1995 Ishizuka ........... H01J 37/32082
216/68
6,156,151 A * 12/2000 Komino ............. H01J 37/3244
156/345.29

(Continued)

*Primary Examiner* — Sylvia MacArthur
*Assistant Examiner* — Michelle Crowell
(74) *Attorney, Agent, or Firm* — Penilla IP, APC

(57) ABSTRACT

Embodiments for processing a substrate in a pulsed plasma chamber are provided. A processing apparatus with two chambers, separated by a plate fluidly connecting the chambers, includes a continuous wave (CW) controller, a pulse controller, and a system controller. The CW controller sets the voltage and the frequency for a first radio frequency (RF) power source coupled to a top electrode. The pulse controller is operable to set voltage, frequency, ON-period duration, and OFF-period duration for a pulsed RF signal generated by a second RF power source coupled to the bottom electrode. The system controller is operable to regulate the flow of species between the chambers to assist in the negative-ion etching, to neutralize excessive positive charge on the wafer surface during afterglow in the OFF-period, and to assist in the re-striking of the bottom plasma during the ON-period.

11 Claims, 10 Drawing Sheets

(51) Int. Cl.
*H01L 21/311* (2006.01)
*H01L 21/67* (2006.01)

(56) References Cited

U.S. PATENT DOCUMENTS

| | | | | |
|---|---|---|---|---|
| 6,162,323 | A * | 12/2000 | Koshimizu | H01J 37/3244 156/345.26 |
| 6,211,081 | B1 * | 4/2001 | Mikata | C23C 16/44 438/680 |
| 6,214,162 | B1 * | 4/2001 | Koshimizu | H01J 37/321 118/723 I |
| 6,261,408 | B1 * | 7/2001 | Schneider | C23C 16/4412 118/715 |
| 6,350,317 | B1 * | 2/2002 | Hao | H01J 37/32568 118/71 |
| 7,695,590 | B2 * | 4/2010 | Hanawa | C23C 16/507 156/345.39 |
| 9,184,028 | B2 * | 11/2015 | Dhindsa | H01L 21/67259 |
| 2003/0013314 | A1 * | 1/2003 | Ying | H01L 21/32136 438/710 |
| 2004/0025791 | A1 * | 2/2004 | Chen | H01J 37/32706 118/728 |
| 2004/0219737 | A1 * | 11/2004 | Quon | H01J 37/321 438/222 |
| 2006/0021701 | A1 * | 2/2006 | Tobe | H01J 37/32357 156/345.31 |
| 2006/0162657 | A1 * | 7/2006 | Cirigliano | H01L 21/67069 118/715 |
| 2006/0234514 | A1 * | 10/2006 | Gianoulakis | C23C 16/455 438/758 |
| 2007/0062645 | A1 * | 3/2007 | Fukuchi | C30B 33/04 156/345.24 |
| 2007/0264427 | A1 * | 11/2007 | Shinriki | C23C 16/5096 427/255.7 |
| 2008/0149596 | A1 * | 6/2008 | Dhindsa | H01J 37/32449 216/67 |
| 2008/0178805 | A1 * | 7/2008 | Paterson | H01J 37/32357 118/723 I |
| 2011/0073257 | A1 * | 3/2011 | Dhindsa | H01J 37/32449 156/345.26 |
| 2012/0031559 | A1 * | 2/2012 | Dhindsa | H01J 37/32697 156/345.26 |
| 2013/0168352 | A1 * | 7/2013 | Fischer | H01J 37/32091 216/67 |

* cited by examiner

Pulsed Plasma Chamber

PULSED PLASMA CHAMBER IN DUAL CHAMBER CONFIGURATION

CLAIM OF PRIORITY

This application is a continuation of and claims priority to and the benefit of U.S. patent application Ser. No. 13/227,404, filed on Sep. 7, 2011, entitled "Pulsed Plasma Chamber In Dual Chamber Configuration," the disclosure of which is incorporated herein by reference in its entirety for all purposes.

CROSS REFERENCE TO RELATED APPLICATIONS

This application is related to U.S. patent application Ser. No. 12/850,552, filed on Aug. 4, 2010, entitled "Plasma Processing Chamber with Dual Axial Gas Injection and Exhaust"; U.S. patent application Ser. No. 12/850,559, filed on Aug. 4, 2010, entitled "Dual Plasma Volume Processing Apparatus for Neutral/Ion Flux Control"; U.S. patent application Ser. No. 13/188,421, filed Jul. 21, 2011, and entitled "Negative Ion Control For Dielectric Etch", all of which are incorporated herein by reference.

BACKGROUND

1. Field of the Invention

The present invention relates to methods, systems, and computer programs for dielectric etching of a semiconductor device, and more particularly, methods, systems, and computer programs for dielectric etching of a semiconductor device in a dual-module capacitively-coupled plasma (CCP) chamber.

2. Description of the Related Art

The manufacturing of integrated circuits includes immersing silicon substrates (wafers) containing regions of doped silicon into chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors.

$SiO_2$ is a common dielectric used in semiconductor manufacturing. The plasmas used for $SiO_2$ etching often include fluorocarbon gases such as carbon tetrafluoride $CF_4$ and octafluorocyclobutane (C—$C4F_8$), along with argon (Ar) and oxygen ($O_2$) gases. The word plasma is used to refer to those gases in which the constituent atoms and molecules have been partially or wholly ionized. Capacitive radio frequency (RF) power coupling is often used for striking and sustaining the plasma because of the low dissociation rates obtained, favoring larger passivating molecules and high ion energies at the surface. To obtain independent control of the ion energy and the ion flux to the silicon substrate, dual frequency capacitive discharges (DF-CCP) are sometimes used.

Current plasma processing systems used in semiconductor wafer fabrication rely on highly interdependent control parameters to control radical separation, radical flux, ion energy, and ion flux delivered to the wafer. For example, current plasma processing systems attempt to achieve necessary radical separation, radical flux, ion energy, and ion flux by controlling a single plasma generated in the presence of the wafer. Unfortunately, chemistry dissociation and radical formation are coupled to ion production and plasma density and often do not work in concert to achieve the desired plasma processing conditions.

Some semiconductor processing equipment uses pulsed RF power sources. The current pulsed RF plasma technology does not provide control of the afterglow plasma during the RF OFF period when the plasma shuts off. Typically, during the RF OFF period, the plasma potential collapses and electrons escape to the walls of the chamber. In the afterglow, the electron density drops and the negative ion density increases. Then ions to escape to the walls as well. The charged species dynamics determines the distribution of charges inside the chamber and, therefore, its etching properties, but unfortunately these dynamics and fluxes of charged species are mostly uncontrolled. The only controls available for the afterglow period are the frequency of the modulation and the duty cycle.

Another problem with pulsed plasma technology is plasma re-ignition when the RF power turns on. If the plasma and the afterglow are extinguished completely during the RF OFF period, re-striking the plasma requires high RF voltage levels. Further, there can be trouble with RF issues, especially when operating at low gas pressures.

It is in this context that embodiments arise.

SUMMARY

Embodiments of the present invention provide systems, methods, and computer programs for processing a semiconductor substrate in a pulsed plasma chamber in a dual chamber configuration.

It should be appreciated that the present invention can be implemented in numerous ways, such as a process, an apparatus, a system, a device or a method on a computer readable medium. Several inventive embodiments of the present invention are described below.

In one embodiment, a wafer processing apparatus with a top chamber and a bottom chamber separated by a plate that fluidly connects the top chamber to the bottom chamber includes a continuous wave (CW) controller, a pulse controller, and a system controller. The CW controller is operable to set the voltage and the frequency for a first radio frequency (RF) power source coupled to a top electrode in the top chamber. The pulse controller is operable to set voltage, frequency, ON-period duration, and OFF-period duration for a pulsed RF signal generated by a second RF power source coupled to the bottom electrode in the bottom chamber. Further, the system controller is operable to set parameters for the CW controller and the pulse controller to regulate the flow of species from the top chamber to the bottom chamber through the plate during operation of the chamber. The flow of species assists in the negative ion density control during afterglow in the OFF period, and assists in the re-striking of the plasma in the bottom chamber during the ON period.

In another embodiment, a method, for processing a wafer in a wafer processing apparatus with a top chamber and a bottom chamber separated by a plate that fluidly connects the top chamber to the bottom chamber, includes an operation for setting first parameters for a continuous radio frequency (RF) signal generated by a first RF power source coupled to a top electrode in the top chamber. The first parameters include a first voltage and a first frequency. Further, the method includes an operation for setting second parameters for a pulsed RF signal generated by a second RF power source coupled to a bottom electrode in the bottom chamber. The second parameters include a second voltage, a second frequency, ON-period duration, and OFF-period duration. The continuous RF signal is applied to the top electrode, and the pulsed RF signal is applied to the bottom electrode. Setting the first parameters and the second parameters regulates the flow of species from the top chamber to the bottom chamber during operation of the chamber. The flow of species assists in a negative ion density control during afterglow in the OFF period, and assists in re-striking a plasma in the bottom chamber during the ON period.

In yet another embodiment, a wafer processing apparatus, with a top chamber and a bottom chamber separated by a plate that fluidly connects the top chamber to the bottom chamber, comprises a CW controller, a pulse controller, and a system controller. The CW controller is operable to set first parameters for a first radio frequency (RF) power source coupled to a top electrode in the top chamber, and the pulse controller is operable to set second parameters for a second pulsed RF signal generated by a second RF power source coupled to a bottom electrode in the bottom chamber. The pulse controller is further operable to set third parameters for a third pulsed RF signal generated by a third RF power source coupled to the bottom electrode. Additionally, the system controller is operable to transfer the first, second, and third parameters to regulate a flow of species from the top chamber to the bottom chamber through the plate during operation of the chamber. The flow of species assists in the negative ion density control during afterglow in the OFF period, and assists in re-striking the plasma in the bottom chamber during the ON period.

Other aspects will become apparent from the following detailed description, taken in conjunction with the accompanying drawings.

BRIEF DESCRIPTION OF THE DRAWINGS

The invention may best be understood by reference to the following description taken in conjunction with the accompanying drawings.

DETAILED DESCRIPTION

The following embodiments provide systems, methods, and computer programs for processing a semiconductor substrate in a pulsed plasma chamber in a dual chamber configuration. It will be apparent, that the present embodiments may be practiced without some or all of these specific details. In other instances, well known process operations have not been described in detail in order not to unnecessarily obscure the present embodiments.

Figure 1:
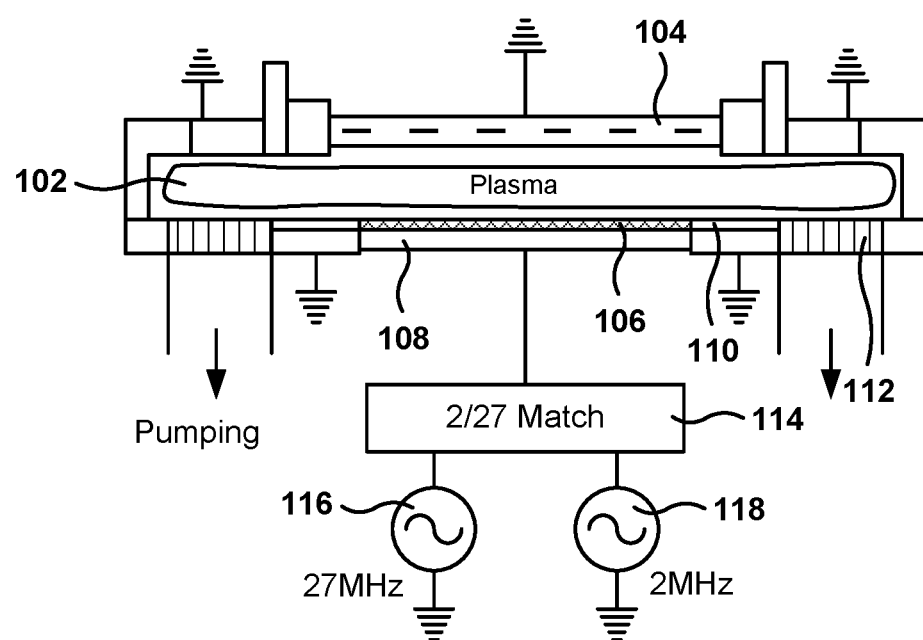
FIG. 1 shows an etching chamber, according to one embodiment.

FIG. 1 shows an etching chamber, according to one embodiment. Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer. This is known as ion bombardment or ion sputtering. Some industrial plasmas, however, do not produce ions with enough energy to efficiently etch a surface by purely physical means. It has been proven that the combined actions of both neutral-gas etching and ion bombardment produces a faster etch rate than simply adding the effects of each method.

In one embodiment, Fluorocarbon gases, such as $CF_4$ and $C-C_4F_8$, are used in the dielectric etch process for their anisotropic and selective etching capabilities, but the principles of the invention can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

The chamber of FIG. 1 includes a top electrode 104 connected to ground, and a bottom electrode 108 powered by low-frequency RF generator 118 and high-frequency RF generator 116. The bottom electrode 108 is connected, via matching network 114, to the low-frequency RF generator 118 and to the high-frequency RF generator 116. In one embodiment, low-frequency RF generator 118 has an RF frequency of 2 MHz, and high-frequency RF generator 116 has an RF frequency of 27 MHz.

The chamber of FIG. 1 includes a gas showerhead on the top electrode 104 to input gas in the chamber, and a perforated confinement ring 112 that allows the gas to be pumped out of the chamber. When substrate 106 is present in the chamber, silicon focus ring 110 is situated next to the substrate such that there is a uniform RF field at the bottom surface of the plasma 102 for uniform etching on the surface of the wafer.

In one embodiment, low-frequency RF generator 118 is pulsing while high-frequency RF generator 116 is not pulsing. In another embodiment, both RF generators are pulsing, and, in yet another embodiment, the high-frequency RF generator 116 is pulsing while low-frequency RF generator 118 is not pulsing, i.e., low-frequency RF generator 118 is always turned on while processing the wafer.

Figure 2:
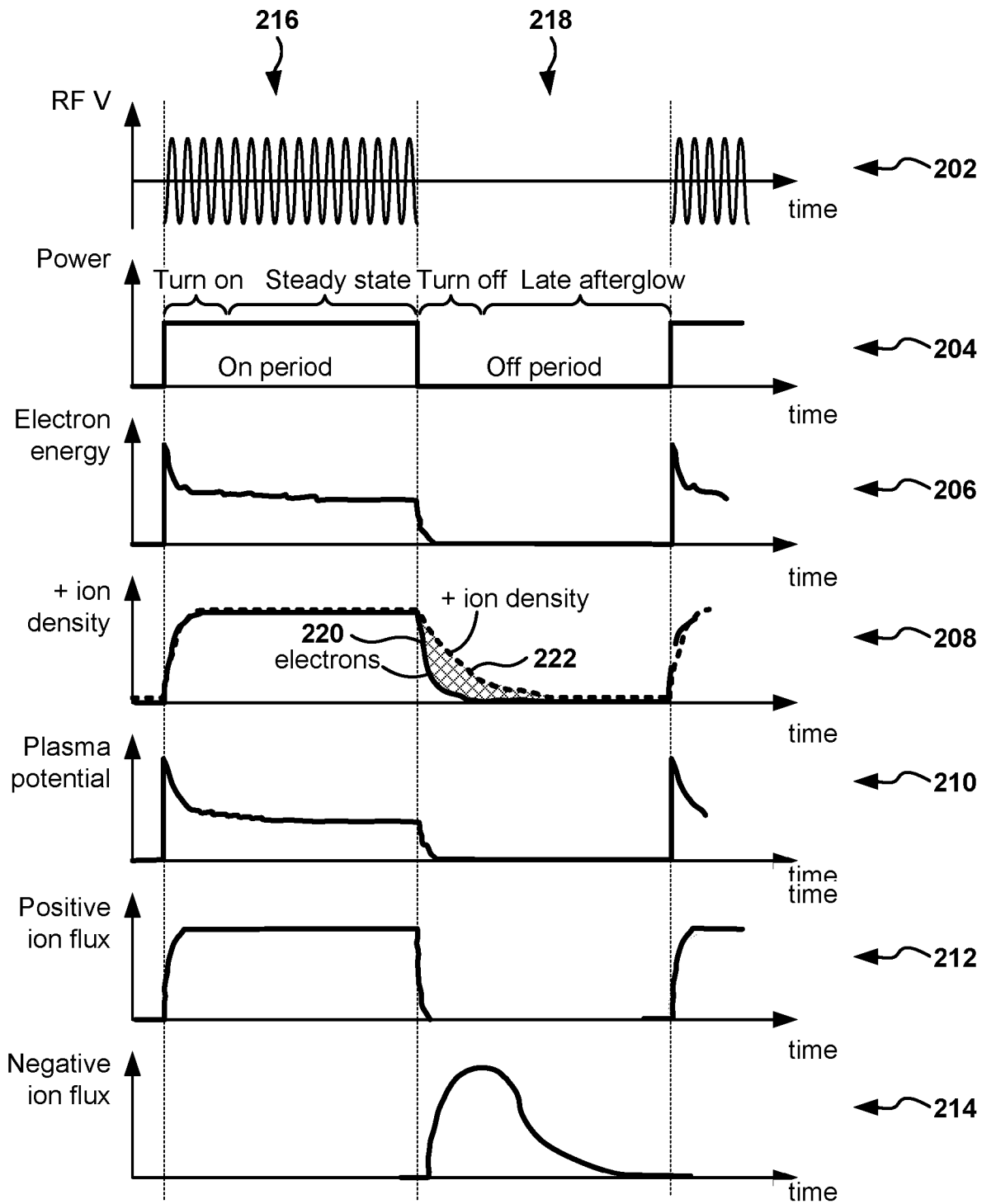
FIG. 2 illustrates the behavior of a pulsed plasma chamber, according to one embodiment.

FIG. 2 illustrates the behavior of a pulsed plasma chamber, according to one embodiment. The pulsed plasma chamber associated with FIG. 1 includes one pulsing RF power source. Graph 202 illustrates the voltage of the RF power source, that includes an ON period, when the RF power source is turned on, and an OFF period, when the RF power source is turned off. The graph 204 illustrates that the power of the RF power source has two levels, one level during the ON period, which is greater than zero, and a second level during the OFF period, which is equal to 0, i.e., the RF power is turned off.

The ON period has two phases: a first phase when the plasma is being ignited (i.e., turned on), and a second phase corresponding to a steady-state when the plasma is present in the chamber. In the turn-on phase, the plasma sheaths are forming and changing as the plasma ignites. There is a larger electron average energy, and a low ion flux density. In addition, the power is not well matched in the turn-on phase due to the varying plasma impedance while igniting the plasma. In the steady state phase, the electron density is nearly constant, and there is a large positive ion flux density. The power is well matched with an almost constant plasma impedance, and the plasma sheets oscillate in steady fashion.

The OFF period has two phases: a first phase when the plasma is being turned off, and a second phase named "late afterglow." In the turn-off phase, there is a rapidly decreasing electron average energy, a rapidly falling ion flux density, and a decreasing plasma potential. The plasma sheaths disintegrate as the electron density decay. In the late-afterglow phase, the power level is zero with a small electron average energy. There is also a small ion flux density, and the negative ions can reach the surfaces of the chamber. The plasma sheaths disintegrate as the electron density decays.

Graph 206 shows the electron energy changing during the ON and OFF periods. In the ON period, the electron energy is high, and in the OFF period, the electron energy decreases to zero. Graph 208 shows the density of electrons 220, and the positive ion density 222. The positive ion density 222 is high during the ON period, and decreases in the OFF period. Therefore, etching with positive ions takes place mainly during the ON period.

Graph 210 shows the evolution of the plasma potential over time. As discussed above, the plasma potential spikes at the beginning of the turn on phase and then reaches a stable value. In the turned off phase, the plasma potential decays until the plasma potential reaches a value of zero. Graph 212 shows the value of the positive ion flux, which is almost constant during the ON period, and quickly decays to 0 in the OFF period.

In addition, graph 214 shows the value of the negative ion flux over time. The negative ion flux is substantially 0 during the ON period, but the negative ion flux has a positive spike in the OFF period, which causes etching in the wafer with negative ions and neutralizing excessive positive charge on the wafer surface during the OFF period.

Pulsing the RF power source helps etching performance because trenching, notching and charging damages can be reduced, when compared to a non-pulsing RF power source. Charges can build up between the top and the bottom of a well during continues discharge, which can cause the deflection of ions. The charge buildup can be reduced in pulsed discharges because the low electron density in the afterglow regime allows more negative ions and electrons to be pulled to the well bottom, to neutralize the positive charges that might have accumulated at the bottom of the well.

Figure 3:
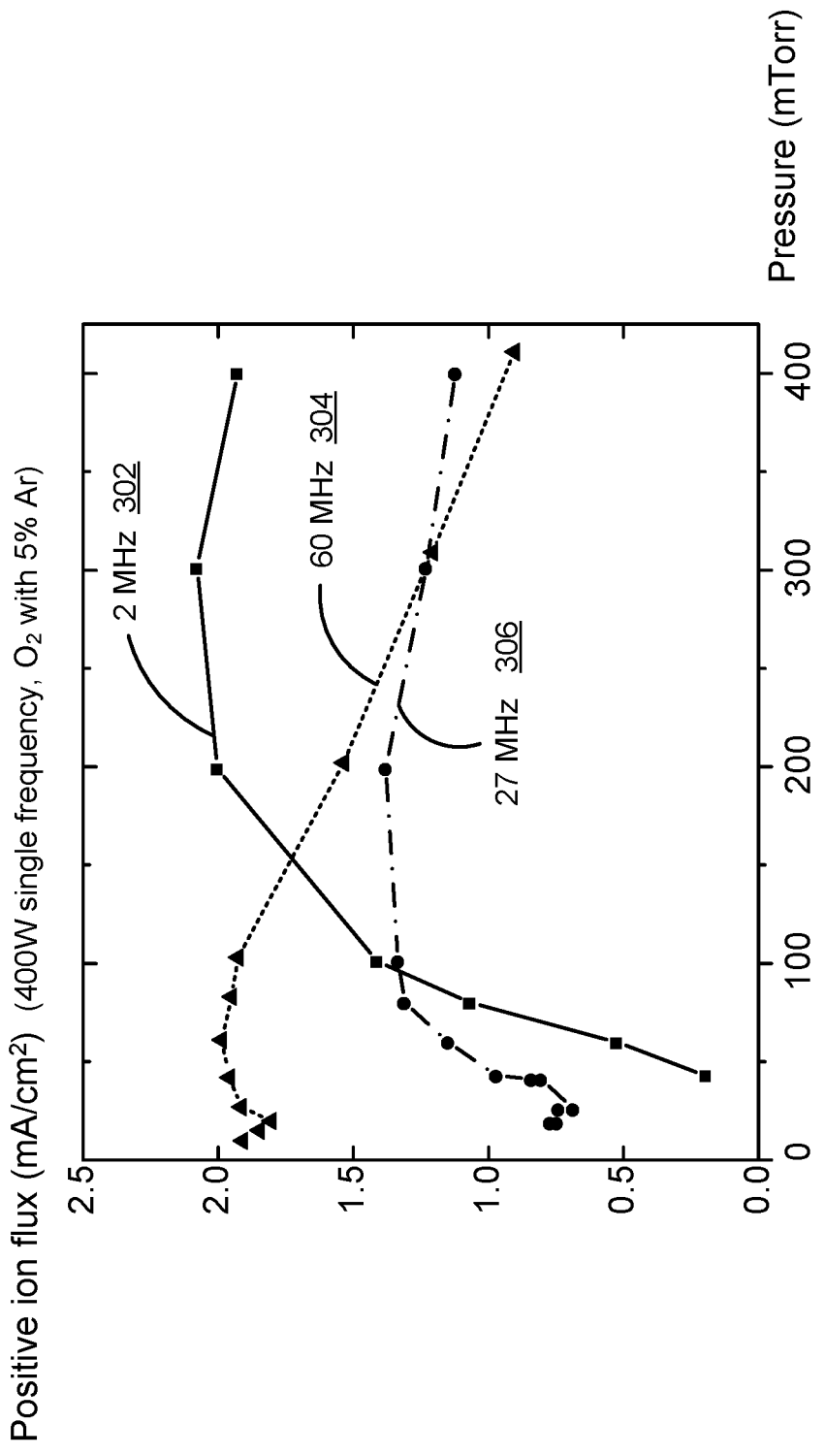
FIG. 3 illustrates the effect of RF power frequency and chamber pressure on the plasma density, according to one embodiment.

FIG. 3 illustrates the effect of RF power frequency and chamber pressure on the plasma density, according to one embodiment. FIG. 3 illustrates some measurements taken on a non-pulsing plasma chamber under different conditions of RF power frequency and pressure in the chamber. The measurements were taken with a single RF power source at 400 W, in a chamber with oxygen and 5% Argon.

Line 302 charts the values for the positive ion flux at different levels of pressure and with an RF frequency of 2 MHz. As the pressure in the chamber increases, the positive ion flux increases to about a maximum positive ion flux at about 300 mTorr. Therefore, for a low RF frequency (2 MHz), the chamber is more efficient at high pressure. Line 306 charts the volumes when the RF frequency is 27 MHz. In this case, the flux gradually increases until the pressure is about 100 mTorr, and then remains substantially constant. Line 304 charts the values for the flux when using an RF frequency of 60 MHz. At this high frequency, the chamber is more efficient at low pressure, and less efficient as the pressure increases.

In general, when using a pulsed RF power, it is more desirable to run the chamber at low pressure, so the ions can penetrate deep in the holes. However, it is relatively hard to strike plasma in a low pressure plasma chamber, because there are fewer electrons when operating at low pressure than when operating at high pressure.

Embodiments of the invention utilize a dual chamber configuration, where the bottom chamber is pulsed and the top chamber is not pulsed. As discussed in more detail below with reference to FIGS. 4-6, the two chambers are separated by a perforated grid that provides flow of species from the top chamber to the bottom chamber. Electrons escape the top plasma and flow to the bottom chamber to assist in the re-striking of the plasma. Since there are more electrons in the bottom chamber, it is easier to re-strike the plasma. Therefore, the use of the dual chamber facilitates having a low pressure chamber and a pulsed RF power source at the same time.

Figure 4:
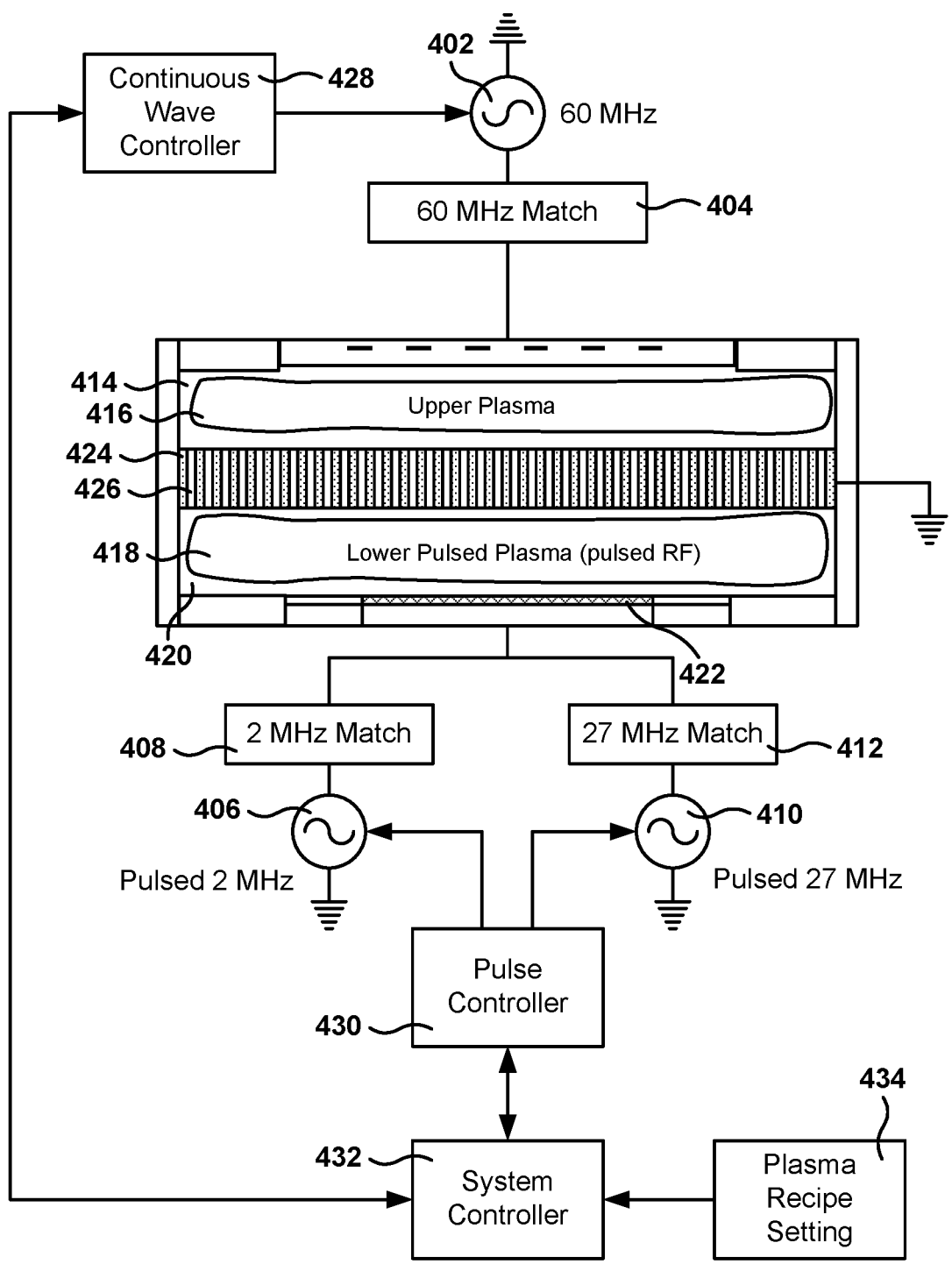
FIG. 4 shows a semiconductor wafer processing apparatus with two chambers, according to one embodiment of the invention.

FIG. 4 shows a semiconductor wafer processing apparatus with two chambers, according to one embodiment of the invention. The semiconductor wafer processing apparatus includes a dual volume plasma source. Top chamber 414 is a Continuous Wave (CW) Radical Control Plasma (RCP), separated from lower pulsed RF capacitive plasma chamber 420 by perforated grounded electrode 424, also referred to herein as plate or grid. The lower volume is a pulsing CCP plasma chamber, and the upper volume acts as a source of radicals, electrons, and ions that are injected into the lower volume.

During the afterglow in the OFF period of the pulsed lower-chamber RF, the flux of neutral and charged species in the lower chamber can be controlled by adjusting the parameters in the top chamber. Having charged species from the RCP top chamber flowing to the lower chamber also helps with re-striking the bottom plasma 418 during the RF ON period. In one embodiment, the afterglow and re-striking is controlled by using different plasma sources in the upper chamber. For example, using an inductively coupled or helicon plasma in the top chamber.

This configuration improves performance of the chamber, because the upper plasma 416 source provides control of the plasma afterglow in the bottom chamber, and provides control of the charged species dynamics for etching substrate 422. Furthermore, the RCP in the top chamber helps to re-ignite the plasma 418 in CCP bottom chamber by providing initial charged species to strike the CCP plasma.

In a single volume pulsing chamber, the only control for negative ion etching is the ON and OFF period cycles. In a dual-volume chamber, since the upper chamber is always on, there is a constant flow of species coming from the top chamber, even in the bottom chamber OFF period. Therefore, it is possible to control the etching process both in the ON and OFF periods. The electrons from the top plasma 416 go through the through-holes 426 that connect the top chamber to the bottom chamber. The electrons carry energy, so the through-holes 426 form electron beams into the bottom chamber.

In one embodiment, bottom chamber 420 is powered by a first pulsed RF power source 406 and by a second pulsed RF power source 410. The RF power sources are connected to the bottom electrode in chamber 420 via respective RF Matches 408 and 412. The top electrode in top chamber 414 is connected to a third RF power source 402 via matching network 404. In one embodiment, the third RF power source 402 provides a continuous wave RF power to top chamber 414.

A pulse controller 430 controls the parameters for the RF power generated by the first pulsed RF power source 406 and by the second pulsed RF power source 410. The parameters that control the first and the second RF power sources include the pulsing cycle (i.e., the duration of the ON and OFF periods) of the RF power sources, the frequency, the voltages, and the power levels for the first and second RF power sources. By controlling the parameters of the RF power sources, the system controls, for example, the RF OFF period and the plasma afterglow in the bottom chamber. This control of the RF parameters also enables the system to control the flux of neutral and charged species from the top chamber. Having charged species from the top chamber traveling to the lower chamber also assists with the re-striking of the plasma at the beginning of the RF ON period, which means that plasma re-strikes faster than in the case of a single chamber device with the same RF power.

A continuous wave controller 428 controls the RF power generated by third RF power source 402. Thus, the continuous wave controller 428 controls the parameters of the RF power on the top chamber, which include frequency, voltage, and power. System controller 432 is in communication with pulse controller 430 and continuous wave controller 428, and system controller 432 sets the control parameters for the RF power in the top and bottom chambers. By controlling the parameters for the CW controller and the pulse controller, the system controller 432 is operable to regulate the flow of species from the top chamber to the bottom chamber through the plate during operation of the chamber, where the flow of species assists in the negative-ion etching and in neutralizing excessive positive charge on the wafer surface during afterglow in the OFF period, and assists in the re-striking of the plasma in the bottom chamber during the ON period. System controller 432 has plasma recipe setting 434 as an input. The plasma recipe setting 434 includes the parameters for the three RF power sources, including frequency, voltage, power, and ON/OFF cycles, and other parameters for the operation of the chamber. Other values in the plasma recipe setting may include the configuration of the plate separating the chambers (e.g., the number of through-holes, the thickness of the plate, the distribution of the through-holes, etc.), the pressure in the top chamber, the pressure in the bottom chamber, duration of the etching cycle, gas flow into the chambers, etc.

Besides controlling the RF power sources, system controller 432 is also operable to control other parameters of the chamber, such as the pressure in the top chamber, the pressure in the bottom chamber, and the configuration of the plate 424 situated between the top and bottom chambers.

The top and bottom chambers have independent controls for the gas flow into the respective chambers. There is a separate source of gas intake in the top chamber. The grid 424 also includes gas outlets that form a gas showerhead into the bottom chamber. Grid 424 has an outside surface which is an insulator dielectric, such as aluminum oxide. In one embodiment, grid 424 is made of aluminum and coated with aluminum oxide. In another embodiment, the grid is made of silicon. Grid 424 is connected to ground. In one embodiment, grid is 27 mm thick, (i.e., the through-holes have the length of 27 mm), and the through-holes have a diameter of 2 mm, although other values are also possible.

Having dual volumes increases the amount of negative ions in the bottom chamber during the OFF period, which improves the etching with negative ions. As electrons from the top chamber arrive at the bottom chamber, the electrons attach to ions and create more negative ions in the chamber during the OFF period.

There are several parameters of the top chamber that affect the performance of the bottom chamber. First, the electron density in the top chamber. The higher the density, the higher the number of electrons traveling to the bottom chamber. Second, the voltage on the sheath of the top chamber, which defines the energy of some electrons, such as the secondary electrons. Third, the pressure in the chamber. The higher the pressure in the top chamber, the more particles (electrons, ions) that will travel to the bottom chamber. Fourth, the thickness of the plate 424 and the density of through-holes 426. The bigger the thickness of the plate, the less number of species that will travel to the bottom chamber. In addition, the higher the density of the through-holes 426, the more species that will travel to the bottom.

The embodiment of FIG. 4 includes a first pulsed RF power source 406 at 2 MHz and a second pulsed RF power source 410 at 27 MHz. The RF power sources are connected to the bottom electrode in chamber 420 via respective RF Matches 408 and 412. The top electrode in top chamber 414 is connected to a third RF power source 402 via matching network 404. The third RF power source 402 is not pulsing.

It is noted that the embodiment illustrated in FIG. 4 is exemplary. Other embodiments may utilize different types of chambers, different frequencies, only one RF power source in the bottom chamber, different size separation plates, different pressures in top and bottom chambers, etc. For example, in one embodiment, top chamber is a CCP plasma chamber. Furthermore, some of the modules described above in the semiconductor wafer processing apparatus may be combined into a single module, or the functionality of a single module may be performed by a plurality of modules. For example, in one embodiment, continuous wave controller 428 and pulse controller 430 are integrated within system controller 432, although other configurations are also possible. The embodiment illustrated in FIG. 5 should therefore not be interpreted to be exclusive or limiting, but rather exemplary or illustrative.

In one embodiment, the top electrode is connected to a RF power source at 27 MHz, and the bottom electrode in the bottom chamber is connected to an RF power source at 2 MHz. In another embodiment, the pressure in the top chamber has a value between 20 mTorr and 60 mTorr, and the pressure in the bottom chamber has a value between 10 mTorr and 19 mTorr.

In yet another embodiment, the top chamber has a single RF power source with a frequency between 27 MHz and 100

MHz, and the bottom chamber has a single RF power source with a frequency between 0.4 MHz and 25 MHz. The voltage in the top power source can be in the range of hundreds of volts (e.g., 100 V to 2000 V or more). The bottom RF power source can have a voltage up to 6000 V or more. In one embodiment, the voltage is 1000 V. In another embodiment, the voltage of the top RF power source has a value between 100 V and 600 V, and the voltage of the bottom RF power source has a value between 1000 V and 6000V.

The pressure in the top chamber and the bottom chamber can have a value between 10 mTorr to 500 mTorr. In one embodiment, the top chamber operates at a pressure of 20 mTorr and the bottom chamber operates at 15 mTorr.

Figure 5:
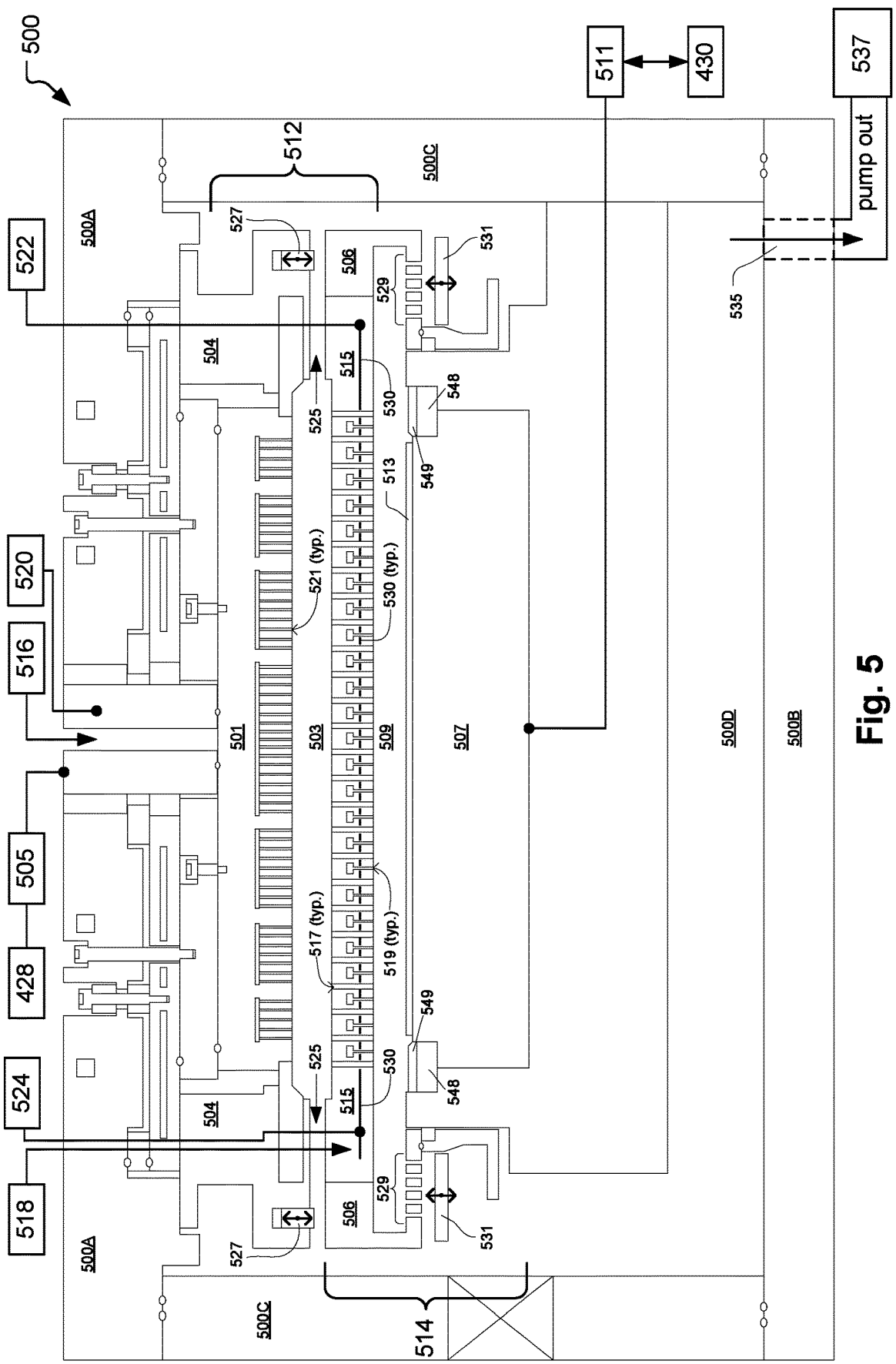
FIG. 5 shows a semiconductor wafer processing apparatus, in accordance with one embodiment of the present invention.

FIG. 5 shows a semiconductor wafer processing apparatus, in accordance with one embodiment of the present invention. The apparatus includes a chamber 500 formed by a top plate 500A, a bottom plate 500B, and walls 500C. In one embodiment, the walls 500C form a contiguous cylindrical shaped wall 500C. In other embodiments, the walls 500C can have other configurations, so long as an interior cavity 500D of the chamber 500 can be isolated from an external environment outside the chamber 500. In various embodiments, the top plate 500A, bottom plate 500B, and walls 500C of the chamber 500 can be formed of a metal that is a good conductor of electricity and heat, and that is chemically compatible with the process gases to which the interior cavity 500D is to be exposed during wafer processing. For example, in various embodiments, metals such as aluminum, stainless steel, or the like, maybe used to form the chamber 500 components.

The chamber 500 structure, including the top plate 500A, bottom plate 500B and walls 500C, is formed of an electrically conducting material and is electrically connected to a reference ground potential. The chamber 500 includes an exhaust port 535 which provides for fluid connection of the interior cavity 500D to an external exhaust pump 537, such that a negative pressure can be applied through the exhaust port 535 to remove gases and particulates from within the interior cavity 500D. In various embodiments, the exhaust pump 537 can be implemented in different ways, so long as the exhaust pump 537 is capable of applying a suction at the exhaust port 535 to draw a fluid flow from the interior cavity 500D of the chamber 500.

A dual plasma processing apparatus is disposed within the interior cavity 500D of the chamber 500. The dual plasma processing apparatus includes an upper plasma chamber 512 that includes an upper plasma generation volume 503. The dual plasma processing apparatus also includes a lower plasma chamber 514 that includes a lower plasma generation volume 509. The upper and lower plasma chambers 512 and 514 are physically and fluidly connected by a gas distribution unit 515, which is disposed to separate the upper and lower plasma generation volumes 503 and 509.

The upper plasma chamber 512 is formed in part by an outer structural member 504 defined around a periphery of the upper plasma chamber 512 and connected to the top plate 500A. The upper plasma chamber 512 also includes a showerhead electrode 501 disposed above the upper plasma generation volume 503 within the outer structural member 504.

During operation, radiofrequency (RF) power is transmitted from an RF power source 505 to the showerhead electrode 501. In one embodiment, the RF power source 505 is defined to provide RF power at multiple frequencies. In one embodiment, frequencies of the RF power source 505 are set within a range extending from 5 kHz to 500 MHz. In another embodiment, frequencies of the RF power source 505 are set within a range extending from 400 kHz to 60 MHz.

Additionally, in one embodiment, the showerhead electrode 501 is connected to a DC bias source 520 to enable control of plasma potential within the upper plasma generation volume 503 independent of the plasma density. The DC bias source 520 is defined to control a bias of the showerhead electrode 501 at various voltage settings extending upward from ground. In one embodiment, the DC bias source 520 of the showerhead electrode 501 can be defined to operate in a pulsed manner to synchronize the plasma in the upper plasma generation volume 503 with the plasma in the lower plasma generation volume 509. More specifically, this pulsed control of the DC bias source 520 can be used to control a time-dependent voltage differential between the plasmas in the upper and lower plasma generation volumes 503 and 509.

Each of the through-holes 517 is defined in open fluid communication through the upper surface of the gas distribution unit 515. However, the gas supply ports 519 are not fluidly exposed through the upper surface of the gas distribution unit 515. Therefore, the gas supply ports 519 are defined to flow plasma process gas into only the lower plasma generation volume 509. In contrast, the through-holes 517 are defined to enable fluid communication between the upper and lower plasma generation volumes 503 and 509. Fluid flow through the through-holes 517 of the gas distribution unit 515 may be controlled by a pressure differential between the upper plasma generation volume 503 and the lower plasma generation volume 509.

It should be understood that the gas distribution unit 515 serves as a RF return path electrode, plasma process gas manifold, fluid flow baffle plate, and ion filter. In various embodiments the gas distribution unit 515 can be formed of metal that is a good conductor of electricity and heat, and that is chemically compatible with the processes to be conducted in the upper and lower plasma generation volumes 503 and 509, such as aluminum, stainless steel, silicon, silicon carbide, silicon oxide, yttrium oxide, or essentially any other material that provides adequate plasma resistance, electrical conduction, and thermal conduction for the plasma processes to which it is exposed.

In various embodiments, the gas distribution unit 515 is connected to its own DC bias source 524 and RF power source 522 to enable the gas distribution unit 515 to provide an appropriate ground return path for the RF power sources 505 and 511, while also providing appropriate bias to affect ions generated in the upper plasma generation volume 503. The RF power source 522 can also be defined to provide RF power at multiple frequencies. Additionally, in one embodiment, electrodes 530 are embedded within the gas distribution unit 515 and are connected to the DC bias source 524 to provide bias voltage for influencing ions generated in the upper plasma generation volume 503. In one embodiment, the embedded electrodes 530 within the gas distribution unit 515 are defined around the through-holes 517, such that bias voltage applied to the embedded electrodes 530 can be used to either accelerate or decelerate ions passing through the through-holes 517. Also, in one embodiment, the embedded electrodes 530 within the gas distribution unit 515 are defined in multiple separately controllable zones, with each zone connected to its own DC bias source 524. This embodiment enables independent regional biasing across the gas distribution unit 515, to provide for independent regional ion control across the gas distribution unit 515.

In one embodiment, portions of the gas distribution unit 515 that are exposed to plasma in either the upper or lower plasma generation volumes 503 and 509 are protected by a covering of plasma resistant material. In one embodiment, the plasma resistant material is formed as a coating. In another embodiment, the plasma resistant material is formed as a protective structure, e.g., plate, that conformally covers the gas distribution unit 515. In either of these embodiments, the plasma resistant material is secured to the gas distribution unit 515 to ensure adequate electrical and thermal conduction between the plasma resistant material and the gas distribution unit 515. In the embodiment of the plasma resistant protective structure, the protective structure, may be secured to the gas distribution unit 515 by a pressure differential between the upper and lower plasma generation volumes 503 and 509, by a number of fasteners, or by a combination thereof. In various embodiments, the plasma resistant coating, the protective structure, used to protect the gas distribution unit 515 can be formed of silicon, silicon carbide, silicon oxide, yttrium oxide, or essentially any other material that provides adequate plasma resistance, electrical conduction, and thermal conduction for the plasma processes to which it is exposed.

Each of the gas supply ports 519 and through-holes 517 is defined to optimize fluid flow through it, while simultaneously preventing adverse intrusion of plasma into it. Fluid flow and plasma intrusion through each of the gas supply ports 519 and though-holes 517 is directly proportional to its size. Therefore, it is necessary to define each of the gas supply ports 519 and though-holes 517 such that its size is small enough to prevent adverse plasma intrusion into it, while remaining large enough to provide adequate fluid flow through it. In various embodiments, the diameter of the gas supply ports 519 is sized within a range extending from about 0.1 mm to about 3 mm In various embodiments, the diameter of the through-holes 517 is sized within a range extending from about 0.5 mm to about 5 mm. It should be understood, however, that in various embodiments the gas supply ports 519 and through-holes 517 can be respectively defined with essentially any diameter size, so long as the diameter size provides for adequate fluid flow there through while simultaneously providing for adequate suppression of plasma intrusion therein.

A chuck 507 is disposed within the interior cavity 500D of the chamber 500 below the lower plasma generation volume 509. In one embodiment, the chuck 507 is cantilevered from the wall 500C of the chamber 500. In one embodiment, the chuck 507 is an electrostatic chuck and provides an electrode for transmitting RF power to the lower plasma generation volume 509. The chuck 507 is defined to hold a substrate 513, i.e., wafer 513, in exposure to the lower plasma generation volume 509. In one embodiment, a wafer edge ring 549 is disposed on the chuck 507 about the periphery of a substrate 513 holding area on the chuck 507. In various embodiments, the wafer edge ring is formed of quartz or silicon. Also, in one embodiment, a conductor 548 is disposed below the wafer edge ring 549, and is connected to drive DC bias through the wafer edge ring 549.

A vertical distance across the lower plasma generation volume 509, as measured perpendicular to both the chuck 507 and the gas distribution unit 515, can be set and controlled by controlling the vertical position of the chuck 507. The vertical distance across the lower plasma generation volume 509 can be set to achieve a sufficient center-to-edge plasma uniformity and density, and can also be set to avoid printing on the wafer 513 by jets of gas flowing from the gas supply ports 519 and through-holes 517. In various embodiments, the vertical distance across the lower plasma generation volume 509 can be set within a range extending from about 1 cm to about 5 cm, or from about 2 cm to about 3.6 cm.

The chuck 507 is further defined to supply RF power from an RF power source 511 to the lower plasma generation volume 509, such that chuck 507 serves as an electrode for the lower plasma generation volume 509. It should be understood that the RF power source 511 of the lower plasma chamber is separate and independent from the RF power source 505 of the upper plasma chamber. Therefore, the RF power supplied to the upper and lower plasma generation volumes 503 and 509 can be separately and independently controlled.

In one embodiment, the RF power source 511 provides a pulsing RF power, with an ON cycle and an OFF cycle. In another embodiment, the RF power source 511 provides RF power at two different frequencies, where the RF power for both frequencies is pulsing. In another embodiment, one RF power at a first frequency is pulsing and the other RF power at a second frequency is not pulsing. Pulse controller 430 is coupled to RF power source 511, and pulse controller 430 sets the parameters for the RF power provided by RF power source 511. These parameters include the frequency, power, and ON/OFF duty cycle of the RF power generated by the power source 511. In addition, continuous wave controller 428 is coupled to the RF power source 505, and continuous wave controller 428 sets the parameters for the RF power generated by RF power source 505, including frequency and power of the RF power generated in the top chamber.

In one embodiment, the RF power source 511 is defined to provide RF power and multiple frequencies. For example, the RF power source 511 can be defined to provide RF power at frequencies of 2 MHz, 27 MHz, and 60 MHz. It should be understood that each of the RF power sources 505 and 511 for the upper and lower plasma chambers 512 and 514, respectively, are connected through their own matching networks to enable transmission of the RF power to the showerhead electrode 501 and the chuck 507, respectively. As previously discussed, in one embodiment, the gas distribution unit 515 serves as a reference ground electrode in the RF power return path for both the upper and lower plasma generation volumes 503 and 509.

The upper plasma chamber is defined to include an exhaust channel 525 through which gases within the upper plasma generation volume 503 are exhausted into the interior cavity 500D of the chamber 500. A pressure throttle ring 527 is defined to move within the exhaust channel 525 to throttle a fluid flow, i.e., flow of gases, from the upper plasma generation volume 503 through the exhaust channel 525 to the interior cavity 500D of the chamber 500. In one embodiment, the pressure throttle ring 527 is defined to move vertically within a conformally defined recessed region within the outer structural member 504 of the upper plasma chamber 512. In this embodiment, the pressure throttle ring 527 can be moved in a controlled manner down into the exhaust channel 525 to reduce a flow area through the exhaust channel 525 and thereby throttle the fluid flow from the upper plasma generation volume 503. In one embodiment, the pressure throttle ring 527 is defined to enable a complete shutoff of flow from the upper plasma generation volume 503 through the exhaust channel 525 into the interior cavity 500D of the chamber 500.

It should be understood that the pressure throttle ring 527 configuration depicted in FIG. 5 is one example embodiment of its implementation. In other embodiments, the pressure throttle ring 527 can be implemented in different ways, so long as the pressure throttle ring 527 provides for control of fluid flow through the exhaust channel 525. The lower plasma chamber is defined to include a set of slotted exhaust channels 529 through which gases within the lower plasma generation volume 509 are exhausted into the interior cavity 500D of the chamber 500.

A pressure control ring 531 is defined to move toward and away from the set of slotted exhaust channels 529 to throttle a fluid flow, i.e., flow of gases, from the lower plasma generation volume 509 through the set of slotted exhaust channels 529 into the interior cavity 500D of the chamber 500. In one embodiment, the pressure control ring 531 is defined as a horizontally oriented annular-shaped disc which is movable in a vertical direction toward and away from the set of slotted exhaust channels 529. The pressure control ring 531 is defined to cover the set of slotted exhaust channels 529 (on the interior cavity 500D side) when placed against the set of slotted exhaust channels 529, i.e., when placed against a lower surface of the horizontally oriented portion of the outer structural member 506 within which the set of slotted exhaust channels 529 is formed.

Fluid flow from the lower plasma generation volume 509 through the set of slotted exhaust channels 529 to the interior cavity 500D of the chamber 500 can be throttled, i.e., controlled, through vertical movement of the pressure control ring 531 toward and away from the set of slotted exhaust channels 529. In one embodiment, the pressure control ring 531 is defined to enable a complete shutoff of flow from the lower plasma generation volume 509 through the set of slotted exhaust channels 529 into the interior cavity 500D of the chamber 500. Also, in one embodiment, a pressure manometer is disposed to measure the pressure within the lower plasma generation volume 509. In this embodiment, this measured pressure within the lower plasma generation volume 509 is used to generate feedback signals for controlling the position of the pressure control ring 531, which in turn provides active control of the pressure within the lower plasma generation volume 509.

It should be understood that both the upper plasma chamber 512 and the lower plasma chamber 514 enclose respective confined plasmas. A confined plasma is beneficial in that its residence time can be controlled by controlling volume, pressure, and flow within the plasma region, i.e., within the upper and lower plasma generation volumes 503 and 509. The plasma residence time affects the dissociation process, which is a factor in radical and neutron formation.

As previously discussed, the upper and lower plasma chambers 512 and 514 have respective RF power source controls, pressure controls, temperature controls, plasma process gas source controls, and gas flow controls. In various embodiments, a pressure within the upper plasma processing volume 503 can be controlled within a range extending from about 100 mTorr to about 1 Torr, or from about 200 mTorr to about 600 mTorr. In various embodiments, a pressure within the lower plasma processing volume 509 can be controlled within a range extending from about 5 mTorr to about 100 mTorr, or from about 10 mTorr to about 30 mTorr.

In the embodiment of FIG. 5 with the showerhead electrode 501, the upper plasma chamber 512 is a capacitively coupled plasma chamber. In this embodiment, a vertical distance across the upper plasma generation volume 503, as measured perpendicularly between the lower surface of the showerhead electrode 501 and the upper surface of the gas distribution unit 515, is set within a range extending from about 1 cm to about 5 cm. In one embodiment, this vertical distance across the upper plasma generation volume 503 is about 2 cm. In another embodiment, the showerhead electrode 501 can be functionally replaced by an induction coil, such that the upper plasma chamber 512 is an inductively coupled plasma chamber. In this embodiment, the vertical distance across the upper plasma generation volume 503 can be up to about 12 cm.

The gas distribution unit 515 is disposed between the upper plasma generation volume 503 and the lower plasma generation volume 509. The gas distribution unit 515 is defined as a plate formed to separate the upper plasma generation volume 503 from the lower plasma generation volume 509, such that an upper surface of the gas distribution unit 515 plate provides a lower boundary of the upper plasma generation volume 503, and such that a lower surface of the gas distribution unit 515 plate provides an upper boundary of the lower plasma generation volume 509.

The gas distribution unit 515 is held in a fixed position by the outer structural member 506 of the lower plasma chamber 514. The gas distribution unit 515 is defined to supply a plasma process gas to the lower plasma generation volume 509 through an arrangement of gas supply ports 519. The gas distribution unit 515 is further defined to include an arrangement of through-holes 517 to provide controlled fluid communication between the upper plasma generation volume 503 and the lower plasma generation volume 509. Each of the through-holes 517 extends through the gas distribution unit 515 plate from its upper surface to its lower surface.

Figure 6:
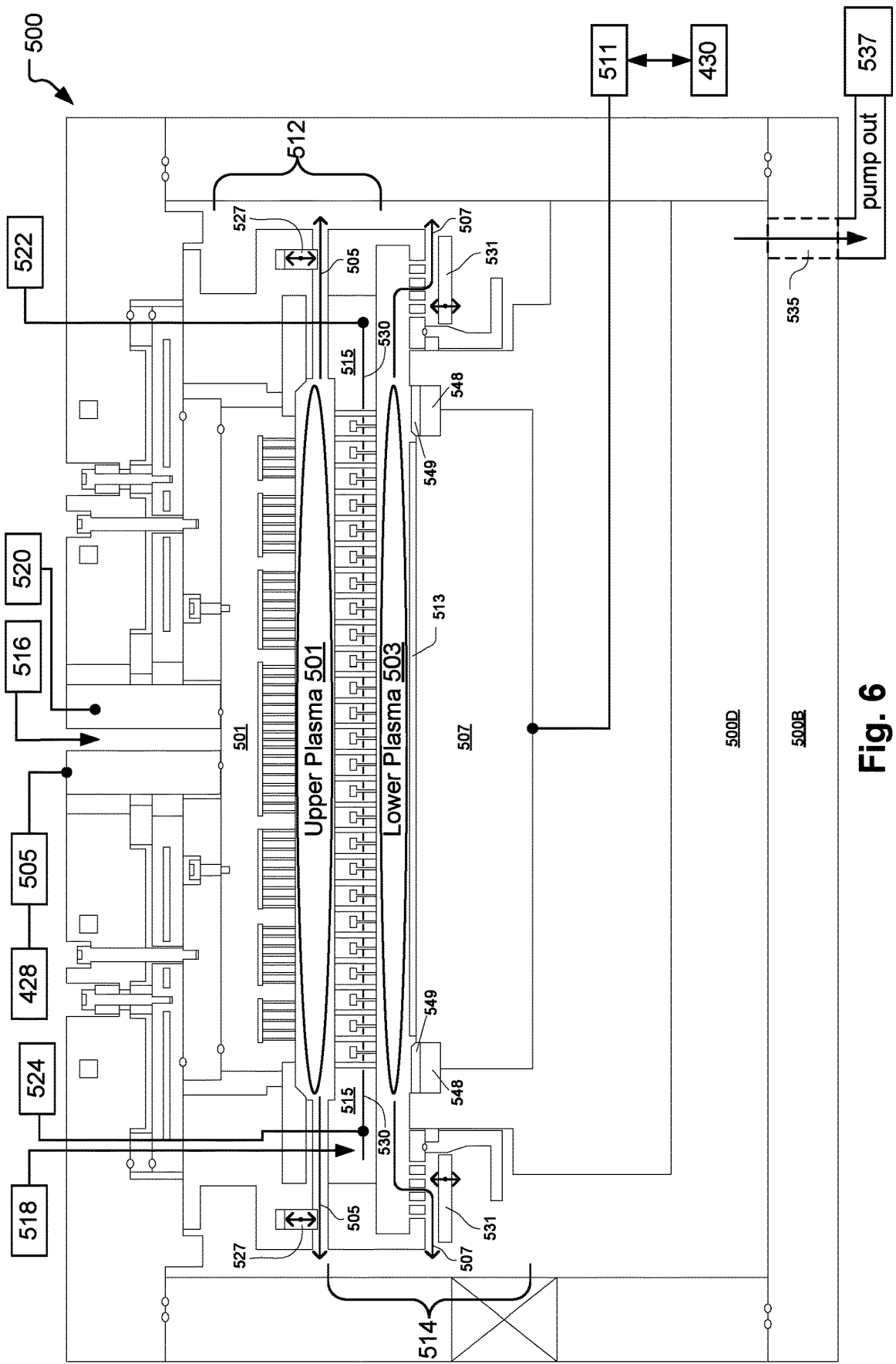
FIG. 6 shows the chamber of FIG. 5 with an upper plasma and a lower plasma, in accordance with one embodiment of the present invention.

FIG. 6 shows the chamber 500 of FIG. 5 with an upper plasma 501 and a lower plasma 503, in accordance with one embodiment of the present invention. It should be understood that the independent control of the upper and lower plasma chambers 512 and 514 provides for extensive possibilities with regard to wafer processing recipes, particularly concerning the independent control of radical and neutral flux relative to ion flux. A couple of example wafer processes are provided below. However, it should be understood that the example wafer processes disclosed herein are provided as examples only and in no way represent any limitation on use of the dual plasma processing chamber 500 disclosed herein.

In one example embodiment, the chamber 500 is used to perform a wafer process that utilizes high fluorine radical and neutral flux with low dissociation of CxFy (C4F8, C4F6, etc.) in the wafer processing plasma. In this example embodiment, a mixture of Ar and NF3 is supplied as the plasma process gas to the upper plasma generation volume 503. The upper plasma generation volume 503 is operated at high pressure and high RF frequency (60 MHz). The high fluorine radical and neutral flux is generated in the upper plasma chamber 503 and is flowed through the through-holes 517 of the gas distribution unit 515. The ions generated in the upper plasma processing volume 503 are filtered by the gas distribution unit 515.

Also, in this example embodiment, a mixture Ar and CxFy gas is supplied as the plasma process gas to the lower plasma generation volume 509. The lower plasma generation volume 509 is operated at low pressure and low to medium RF frequency (2 MHz and 27 MHz) with pulsing RF power. The low RF frequency of the lower plasma generation volume 509 corresponds to low dissociation of CxFy in the plasma exposed to the wafer 513. It should be appreciated that the high power required in the upper plasma generation volume 503 to generate the necessary fluorine radical and neutral flux would cause high dissociation of CxFy if applied to the lower plasma generation volume 509. Therefore, the dual plasma chamber 500 enables performance of the above described process.

In another example embodiment, the chamber 500 is used to perform a wafer process that utilizes high dissociation of CxFy (C4F8, C4F6, etc.) in a high pressure volume with a high density Ar plasma in a low pressure volume. In this example embodiment, a mixture of CxFy and Ar is supplied as the plasma process gas to the upper plasma generation volume 503. The upper plasma generation volume 503 is operated at high pressure and high RF frequency (60 MHz) to cause high dissociation of CxFy. The highly dissociated CxFy generated in the upper plasma chamber 503 flows through the through-holes 517 of the gas distribution unit 515. The ions generated in the upper plasma processing volume 503 are filtered by the gas distribution unit 515. Also, in this example embodiment, Ar gas is supplied as the plasma process gas to the lower plasma generation volume 509. The lower plasma generation volume 509 is operated at low pressure and low to medium RF frequency (2 MHz and 27 MHz) to generate a high density Ar plasma with high ion flux.

It should be appreciated that the dual plasma chamber 500 is defined to decouple radical and neutral flux generation from ionic plasma generation. Also, in one embodiment, the lower plasma chamber 514 can be inactive, i.e., exhaust only, such that radical and neutral flux from the upper plasma chamber 512 can be applied to the wafer 513 without exposing the wafer 513 to a plasma.

Figure 7:
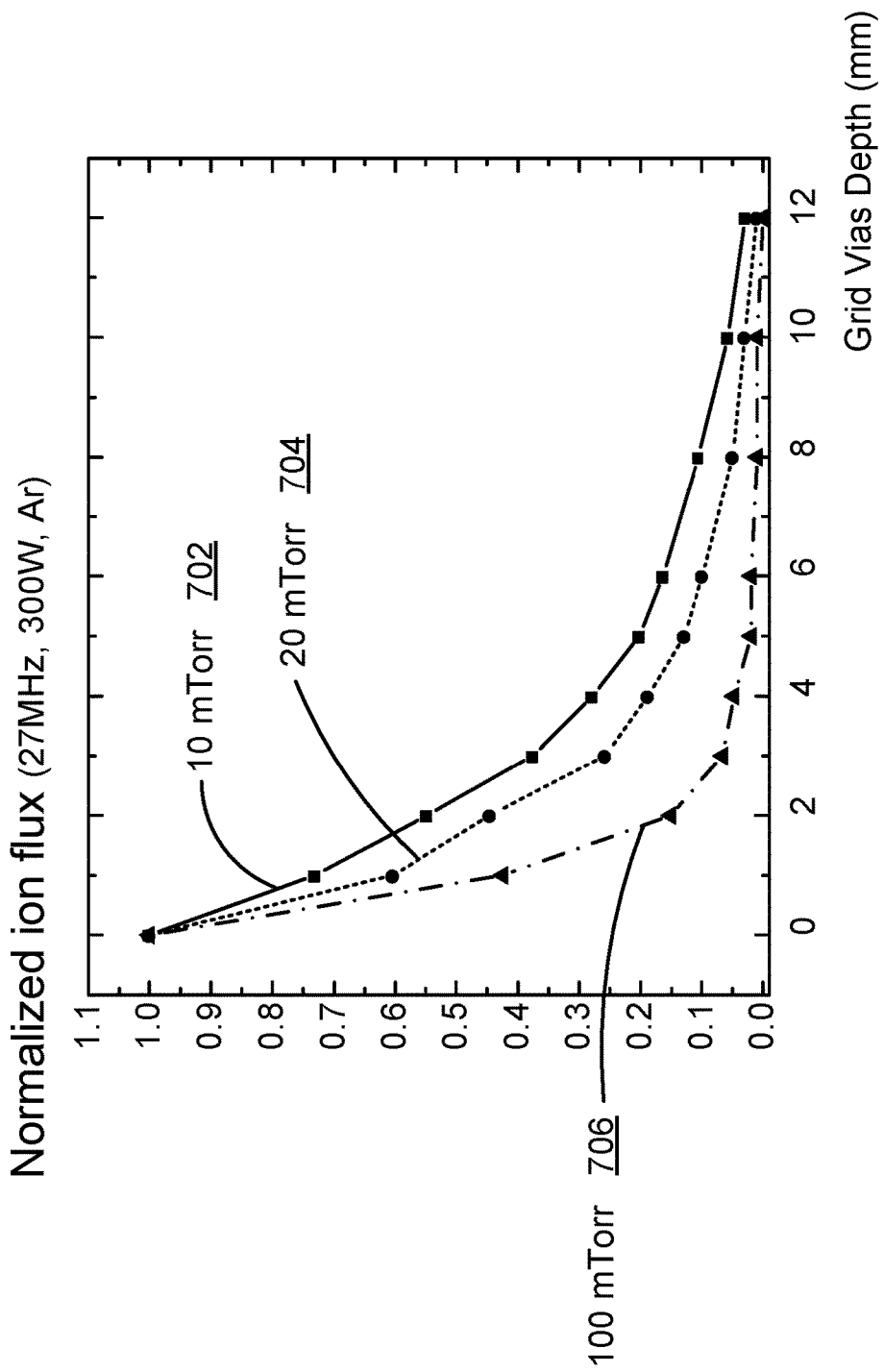
FIG. 7 illustrates the normalized ion flux as a function of the plate thickness, according to one embodiment.

FIG. 7 illustrates the normalized ion flux as a function of the plate thickness, according to one embodiment. One of the parameters that affect the interaction between the upper chamber and the lower chamber is the configuration of the plate between the chambers. The thickness defines the length of the through-holes, and the longer the through-holes are, the bigger the obstacle for the ions and electrons to travel from the upper chamber to the lower chamber.

The chart in FIG. 7 shows the measurements taken in a dual chamber for the normalized ion flux at different pressures in the lower chamber, with an RF frequency of 27 MHz at 300 W in argon chamber. As expected, the ion flux decreases as the length (depth) of the through-holes increases. In addition, the higher the pressure in the lower chamber, the lower the ion flux is because the higher pressure in the lower chamber increases the resistance for fluids and species to travel to the bottom chamber.

A second factor affecting the flow between the upper chamber and the lower chamber, is the diameter of the through-holes. As expected, the bigger the diameter of the through-holes is, the bigger the flux of particles to the lower chamber. Another factors affecting the interaction between the upper chamber on the lower chamber are the number and distribution of through-holes in the plate. The greater the number of through-holes is, the more electrons will travel from the upper chamber to the lower chamber, as there are more paths between the upper and lower chambers.

In one embodiment, grid is 27 mm thick, (i.e., the through-holes have a length of 27 mm), and the through-holes have a diameter of 2 mm, although other values are also possible. In one embodiment, the thickness of the grid is between 10 mm and 30 mm In various embodiments, the diameter of the through-holes is sized within a range extending from about 0.5 mm to about 5 mm. It should be understood, however, that in various embodiments the through-holes can be respectively defined with essentially any diameter size, so long as the diameter size provides for adequate fluid flow there through while simultaneously providing for adequate suppression of plasma intrusion therein.

Figure 8:
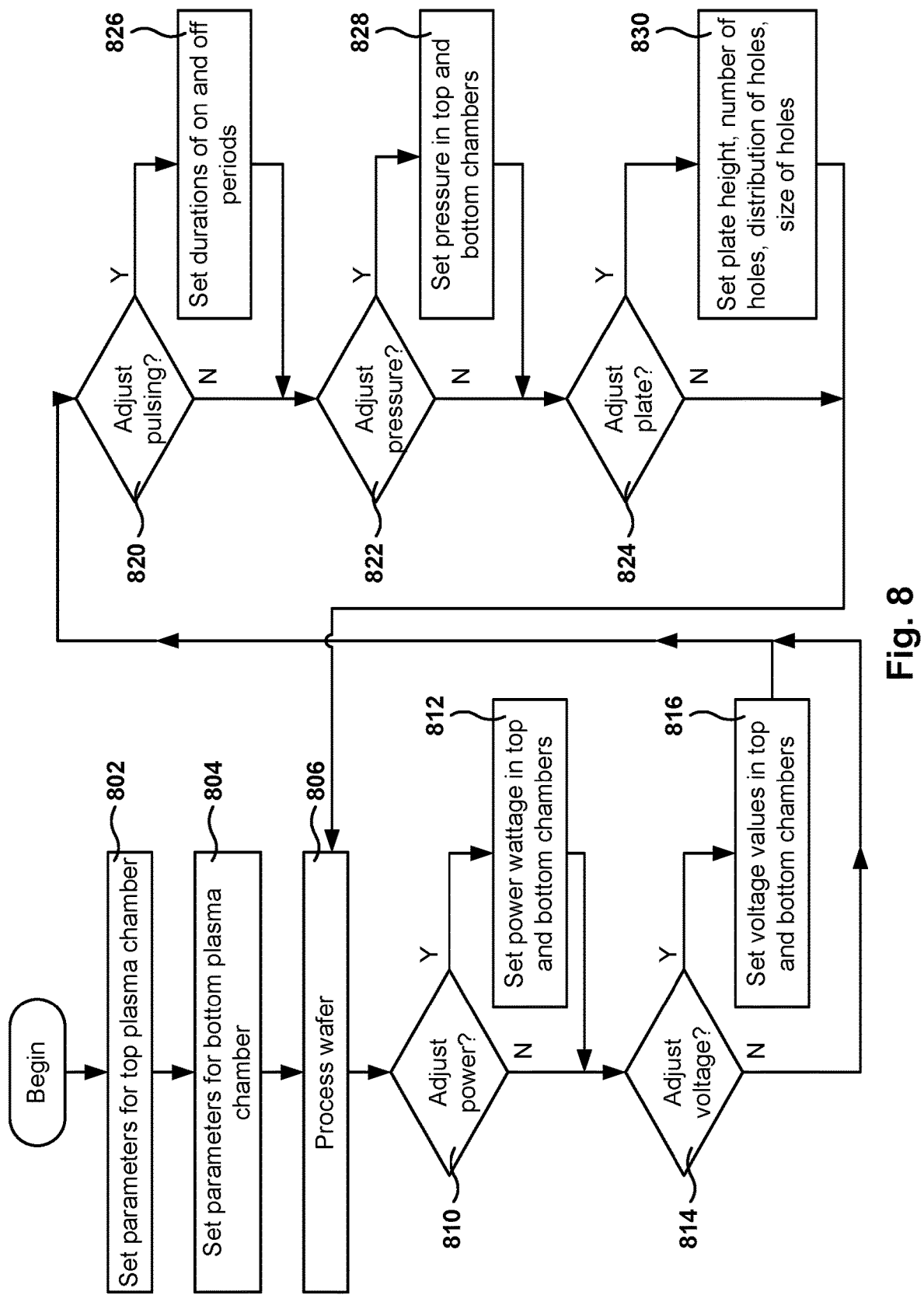
FIG. 8 shows the flow of an algorithm for operating a semiconductor wafer processing apparatus, in accordance with one embodiment of the invention.

FIG. 8 shows the flow of an algorithm for operating a semiconductor wafer processing apparatus, in accordance with one embodiment of the invention. The embodiment of FIG. 8 illustrates the different operations that can be performed to control the flow of species between the upper chamber and the lower chamber.

In operation 802, the parameters for the top plasma chamber are set. These parameters include the operating frequency of the RF power source, the voltage and wattage of the RF power source, the pressure in the upper chamber, the gases injected in the upper chamber, etc. In operation 804, the parameters for the bottom plasma chamber are set. The same parameters described above for the upper chamber may also be adjusted for the bottom chamber. In addition, the parameters for the plate separating the upper chamber and the lower chamber are also defined. The parameters for the plate include the thickness of the plate, the number and distribution of through-holes in the plate, the diameter of the through-holes, etc.

In operation 806, a wafer is processed in the lower chamber with the parameters set in operations 802 and 804. After the wafer is processed, the operator may decide to adjust some of the parameters of the chamber to improve wafer processing. To determine the quality of etching in the chamber, probes can be used to measure the performance of the chamber. For example, a probe can be used to measure the ion flux from the top chamber to the bottom chamber.

In operation 810, a check is made to determine if the power is to be adjusted, and if the result of the check in operation 810 is that an adjustment is required, the method continues to operation 812. In operation 812, the wattage for the top or bottom chambers, or for both top and bottom chambers, are set. As the power is increased in the chambers, the number of particles in the plasma will also increase.

In operation 814, a check is performed to determine if the voltage of the RF power sources is to be adjusted, and if the voltage is to be adjusted, new voltage levels for the top and/or bottom chambers are set, in operation 816. As previously discussed, the bottom chamber includes a pulsing RF power source. A check is performed to determine if the pulsing cycle of the RF power source is to be adjusted, in operation 820. In operation 826, the durations of the ON and OFF periods (i.e., the cycle of the RF signal) are set. For example, if negative ion etching needs to be increased, the OFF period may be increased to allow for a higher afterglow etching.

In operation 822, a check is made to determine if the pressure in the first chamber or the second chamber is to be adjusted. If the pressure in either chamber is to be changed, in operation 828, the pressure from the top chamber, or the bottom chamber, or both chambers are adjusted. As described above with reference to FIG. 7, the higher the pressure difference between the top chamber and the bottom chamber, the higher the flow of particles between the chambers.

Further, in operation 824, a check is made to determine if the parameters of the plate need to be changed. As previously discussed, several parameters of the plate can be changed, such as thickness of the plate, the number, distribution, and size of the through-holes, etc. If the parameters of the plate are to be adjusted, in operation 830, any of the aforementioned parameters of the plate can be adjusted.

After all the parameters of the chamber are adjusted, if any, the method flows back to operation 806 and continues with the processing of wafers. It is noted that the embodiments illustrated in FIG. 8 are exemplary. Other embodiments may utilize different adjustments, or perform adjustments in a different order, or perform checks periodically, etc. The embodiments illustrated in FIG. 8 should therefore not be interpreted to be exclusive or limiting, but rather exemplary or illustrative.

Figure 9:
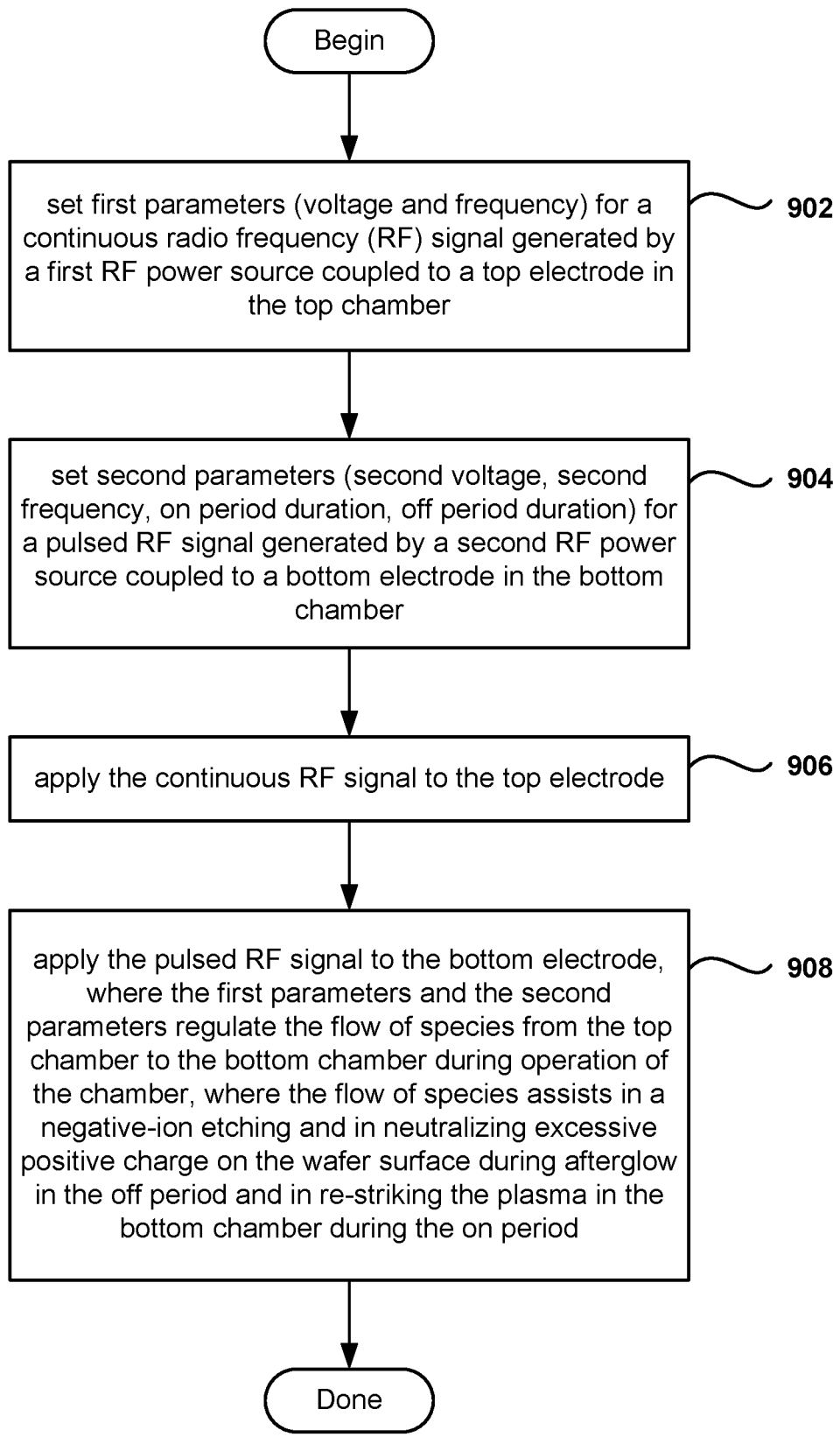
FIG. 9 shows the flow of an algorithm for processing a wafer, in accordance with one embodiment of the invention.

FIG. 9 shows the flow of an algorithm for processing a wafer, in accordance with one embodiment of the invention. In operation 902, first parameters are set for a continuous radio frequency (RF) signal generated by a first RF power source coupled to a top electrode in the top chamber. The first parameters include a first voltage and a first frequency. Further, in operation 904, second parameters are set for a pulsed RF signal generated by a second RF power source coupled to a bottom electrode in the bottom chamber, where the second parameters include a second voltage, a second frequency, an ON-period duration, and an OFF-period duration.

In operation 906, the continuous RF signal is applied to the top electrode, and in operation 908, the pulsed RF signal is applied to the bottom electrode. Setting the first parameters and the second parameters regulates the flow of species from the top chamber to the bottom chamber during operation of the chamber. The flow of species assists in the negative-ion etching and in neutralizing excessive positive charge on the wafer surface during afterglow in the OFF period, and assists in re-striking the plasma in the bottom chamber during the ON period.

Figure 10:
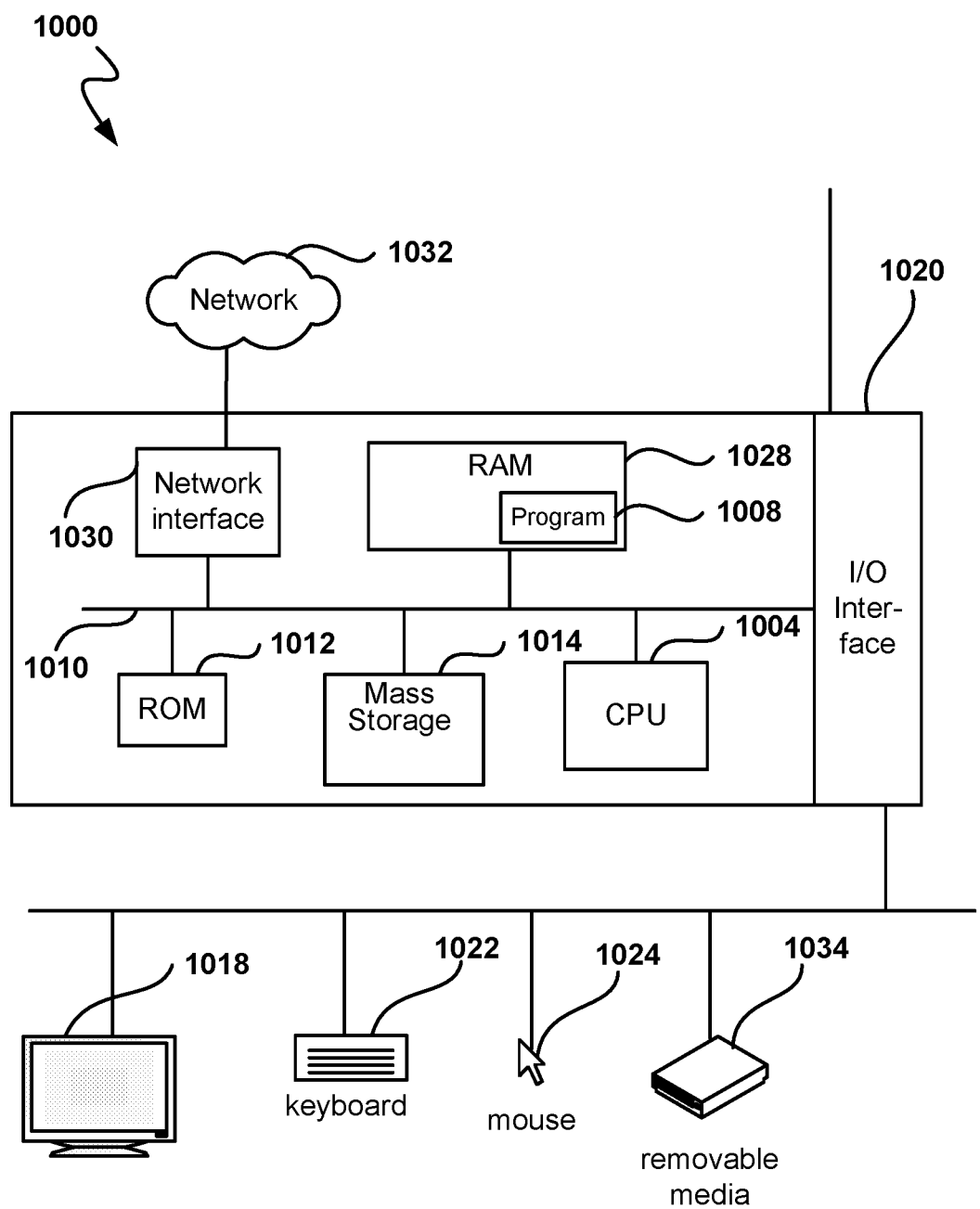
FIG. 10 is a simplified schematic diagram of a computer system for implementing embodiments of the present invention.

FIG. 10 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1004, which is coupled through bus 1010 to random access memory (RAM) 1028, read-only memory (ROM) 1012, and mass storage device 1014. Phase control program 1008 resides in random access memory (RAM) 1028, but can also reside in mass storage 1014 or ROM 1012.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The invention can also be practiced in distributed computing environments where tasks are performed by remote processing devices that are linked through a wire-based or wireless network.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wafer processing apparatus, comprising:
a top chamber including an upper plasma generation volume;
a bottom chamber including a lower plasma generation volume and a lower portion below a pedestal configured to support a wafer;
a plate separating the top chamber and the bottom chamber, the plate having a plurality of holes that enable a flow of species from the upper plasma generation volume of the top chamber to the lower plasma generation volume of the bottom chamber during operation;

a horizontal channel that exhausts gas peripherally out of the upper plasma generation volume of the top chamber to the lower portion of the bottom chamber, wherein the horizontal channel connects the upper plasma generation volume of the top chamber and the lower portion of the bottom chamber, wherein the lower portion of the bottom chamber is separated from the upper plasma generation volume of the top chamber and the lower plasma generation volume of the bottom chamber;

a pressure throttle ring disposed in the horizontal channel for controlling an amount of the gas exhausted peripherally out of the top chamber during the operation to form plasma in the upper plasma generation volume of the top chamber and plasma in the lower plasma generation volume of the bottom chamber and to control pressure in the upper plasma generation volume of the top chamber during the operation;

a continuous wave (CW) controller operable to set a first voltage and a first frequency for a first radio frequency (RF) power source coupled to a top electrode in the top chamber, the first RF power source configured to provide a continuous RF power during the operation of the chamber;

a pulse controller operable to set a second voltage, a second frequency, an ON-period duration, and an OFF-period duration for a pulsed RF signal generated by a second RF power source coupled through a first match circuit to a bottom electrode in the bottom chamber; and a system controller configured to set parameters for the top chamber and parameters for the bottom chamber to regulate the flow of species from the upper plasma generation volume of the top chamber to the lower plasma generation volume of the bottom chamber through the plate during the ON-period duration and during the OFF-period duration.

2. The wafer processing apparatus of claim 1,
wherein the parameters for the top chamber include the first voltage and the first frequency for the first RF power source,
wherein the parameters for the bottom chamber include the second voltage, the second frequency, the ON-period duration, and the OFF-period duration for the pulsed RF signal.

3. The wafer processing apparatus of claim 1,
wherein the system controller is further operable to set a first pressure in the upper plasma generation volume of the top chamber and a second pressure in the lower plasma generation volume of the bottom chamber,
wherein the first pressure is higher than the second pressure.

4. The wafer processing apparatus as recited in claim 3,
wherein the upper plasma generation volume of the top chamber is operable to have the first pressure between 20 mTorr and 60 mTorr during processing,
wherein the lower plasma generation volume the bottom chamber is operable to have the second pressure between 10 mTorr and 19 mTorr during processing.

5. The wafer processing apparatus of claim 1,
wherein the ON-period duration is different than the OFF-period duration.

6. The wafer processing apparatus of claim 1,
wherein the ON-period duration is equal to the OFF-period duration.

7. The wafer processing apparatus as recited in claim 1, wherein the first frequency of the first RF power source has a value between 27 MHz and 100 MHz.

8. The wafer processing apparatus as recited in claim 1, wherein the second frequency of the second RF power source has a value between 0.4 MHz and 25 MHz.

9. The wafer processing apparatus as recited in claim 1, wherein the first voltage of the first RF power source has a value between 100 V and 600 V.

10. The wafer processing apparatus as recited in claim 1, wherein the second voltage of the second RF power source has a value between 1000 V and 6000 V.

11. The wafer processing apparatus of claim 1, wherein an interior cavity surrounds the top chamber and the bottom chamber.

* * * * *